(12) United States Patent
Shi et al.

(10) Patent No.: US 8,548,402 B2
(45) Date of Patent: Oct. 1, 2013

(54) POWER AMPLIFICATION DEVICE AND METHOD FOR ACQUIRING POWER ADJUSTING COEFFICIENT

(75) Inventors: Zhan Shi, Beijing (CN); Takanori Iwamatsu, Kawasaki (JP); Jianmin Zhou, Beijing (CN)

(73) Assignee: Fujitsu Limited, Kawasaki (JP)

( * ) Notice: Subject to any disclaimer, the term of this patent is extended or adjusted under 35 U.S.C. 154(b) by 63 days.

(21) Appl. No.: 13/246,516

(22) Filed: Sep. 27, 2011

(65) Prior Publication Data
US 2012/0081178 A1   Apr. 5, 2012

(30) Foreign Application Priority Data
Sep. 30, 2010   (CN) .......................... 2010 1 0514966

(51) Int. Cl.
*H04B 1/04*   (2006.01)
*H04K 3/00*   (2006.01)

(52) U.S. Cl.
USPC ...................................... 455/114.3; 375/296

(58) Field of Classification Search
USPC ................................ 455/114.3; 375/296, 297
See application file for complete search history.

(56) References Cited

U.S. PATENT DOCUMENTS

| 2008/0051042 | A1* | 2/2008 | Komaili et al. | ............ 455/114.3 |
| 2008/0095264 | A1* | 4/2008 | Deng et al. | .................... 375/296 |

* cited by examiner

*Primary Examiner* — Lee Nguyen
(74) *Attorney, Agent, or Firm* — Arent Fox LLP (57) ABSTRACT

An embodiment of the invention discloses a power amplification device and method and a method for acquiring a power adjusting coefficient. The power amplification device according to one embodiment of the invention includes: a power control module configured to perform power adjusting on an input signal; a power amplification module configured to perform power amplification on the signal subjected to the power adjusting by the power control module; and a pre-distortion module configured to compensate for nonlinear characteristic of the power amplification module; wherein, said power control module is coupled between said pre-distortion module and said power amplification module in series; alternatively, said pre-distortion module is coupled between said power control module and said power amplification module in series. With the embodiment of the invention, a transmitter can be provided with a spectrum including a low side lobe even upon startup.

16 Claims, 8 Drawing Sheets

POWER AMPLIFICATION DEVICE AND METHOD FOR ACQUIRING POWER ADJUSTING COEFFICIENT

CROSS-REFERENCE TO RELATED APPLICATION

This application is a U.S. Patent Application, which claims priority to Chinese Priority Application No. 201010514966.9, filed Sep. 30, 2010, the entire specifications, claims and drawings of which are incorporated herewith by reference.

FIELD OF THE INVENTION

The present invention generally relates to a nonlinear power amplification system and in particular to a power amplification device and a method for acquiring a power adjusting coefficient.

BACKGROUND OF THE INVENTION

A Power Amplifier (PA) is an important component in an electronic device and can amplify the power of a weak electronic signal for the purpose of transmission and emission thereof. Generally, a characteristic curve reflecting a power relationship between an input signal and an output signal of the power amplifier can be divided into a linear region, a nonlinear region and a saturated region as the input signal is increased in power. An output of the Power Amplifier (PA) substantially results from linear amplification of the input signal in a region where the input signal is small in amplitude, but the Power Amplifier (PA) exhibits a nonlinear characteristic gradually noticeable as the input signal is incremented in amplitude so that the output signal will be distorted until it becomes saturated in the end. In the frequency domain, this nonlinearity appears as the output signal with a spectrum including an elevated side lobe and a distorted major lobe, where the elevated side lobe may discourage normal operation of other devices operating in adjacent channels. As new modulation schemes emerge, the envelope of the input signal has an increasing dynamic range resulting in inevitable nonlinear distortion. Therefore, the nonlinear characteristic of the PA has to be technically compensated for to remedy such distortion. Pre-distortion is a working approach for this purpose.

However, a pre-distorter has to operate with a specific coefficient, and if the coefficient of the pre-distorter is acquired adaptively, the coefficient of the pre-distorter can be acquired with an adaptive algorithm only after a transmitter is started to operate. Since the nonlinearity of PA has not been fully compensated for after the transmitter is started until the adaptive algorithm fully converges, the spectrum of the output signal still may have an elevated side lobe which may discourage normal operation of other devices operating in adjacent channels.

SUMMARY OF THE INVENTION

In view of this, an embodiment of the invention provides a power amplification device to facilitate a transmitter with a spectrum including a low side lobe from the time of being started.

An embodiment of the invention further provides a method for acquiring a power adjusting coefficient in which a set of coefficients can be acquired offline to reduce the complexity of an online process of a coefficient adjuster and also facilitate a transmitter with a spectrum including a low side lobe from the time of being started.

According to an aspect of the embodiments of the invention, there is provided a power amplification device comprising: a power control module configured to perform power adjusting on an input signal; a power amplification module configured to perform power amplification on the signal subjected to the power adjusting by the power control module; and a pre-distortion module configured to compensate for nonlinear characteristic of the power amplification module; wherein said power control module is coupled between said pre-distortion module and said power amplification module in series; alternatively, said pre-distortion module is coupled between said power control module and said power amplification module in series.

According to another aspect of the embodiments of the invention, there is provided a method for acquiring a power adjusting coefficient, comprising: performing power adjusting on an input signal according to a coefficient; performing power amplification on the signal subjected to the power adjusting; when the signal subjected to the power amplification does not match a preset first spectrum condition, reducing said coefficient until the signal subjected to the power amplification matches the preset first spectrum condition, and then determining said coefficient to be a state value of the power adjusting coefficient; performing pre-distortion self-adaptive algorithm searching according to the signal subjected to the power amplification, to compensate for nonlinearity produced during the power amplification; increasing said coefficient when the self-adaptive algorithm searching meets a convergence condition; and repeatedly performing the above steps until said power adjusting coefficient becomes 1; wherein said coefficient is larger than 0 and not larger than 1.

In addition, according to another aspect of the invention, there is also provided a storage medium including machine readable program codes which, when being executed on an information processing device, cause the information processing device to perform the above mentioned power amplification method and the method for acquiring a power adjusting coefficient according to the invention.

Moreover, according to a still further aspect of the invention, there is also provided a program product including machine executable instructions which, when being executed on an information processing device, cause the information processing device to perform the above mentioned power amplification method and the method for acquiring a power adjusting coefficient according to the invention.

In the above mentioned power amplification device and the method for acquiring a power adjusting coefficient according to the embodiments of the invention, pre-distortion processing can be combined with power control so that the output signal of the power amplifier can be provided with a spectrum including a low side lobe due to power control, thus facilitating the transmitter with a spectrum including a low side lobe even upon startup.

Other aspects of the embodiments of the invention will be presented in the following detailed description of the invention intended to fully disclose but not limit preferred embodiments of the invention.

BRIEF DESCRIPTION OF THE DRAWINGS

The foregoing and other objects and advantages of the embodiments of the invention will further be described below in connection with the particular embodiments with reference

DETAILED DESCRIPTION OF THE INVENTION

Embodiments of the invention will be described below with reference to the drawings.

In order to facilitate understanding of the embodiments of the invention, the operating principle of a pre-distorter will firstly be introduced briefly.

Typically, the fundamental characteristic of a Power Amplifier (PA) can be described as:

$$Y = P\{X\} \tag{1}$$

Figure 1:
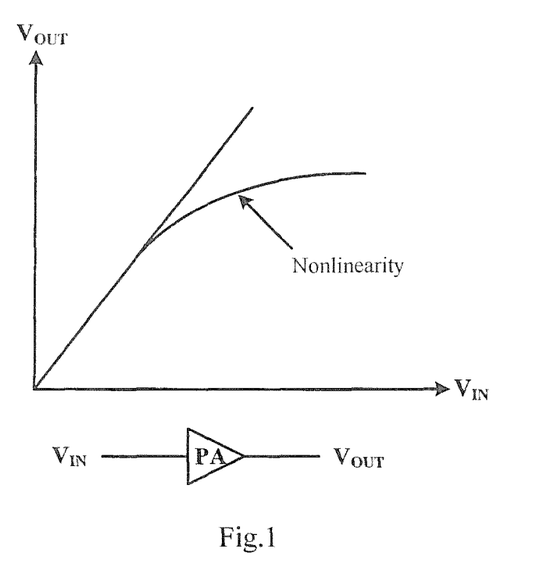
FIG. 1 is a schematic diagram of nonlinear characteristic of input vs. output signals of a Power Amplifier (PA)

In view of nonlinearity, generally:

$$Y \neq aX \tag{2}$$

Where a is a constant, and this inequality means nonlinearity of the PA so that an input signal may not be amplified perfectly and correspondingly the spectrum of an output signal may include an elevated side lobe. FIG. 1 illustrates nonlinear characteristic of input vs. output signals of the Power Amplifier (PA).

However, if a pre-distorter $Q\{\ \}$ is constructed appropriately by pre-distortion so that:

$$Z = Q\{X\} \tag{3}$$

And the pre-distorter is coupled preceding the PA, then ideally:

$$Y = P\{Q\{X\}\} \tag{4}$$

Figure 2:
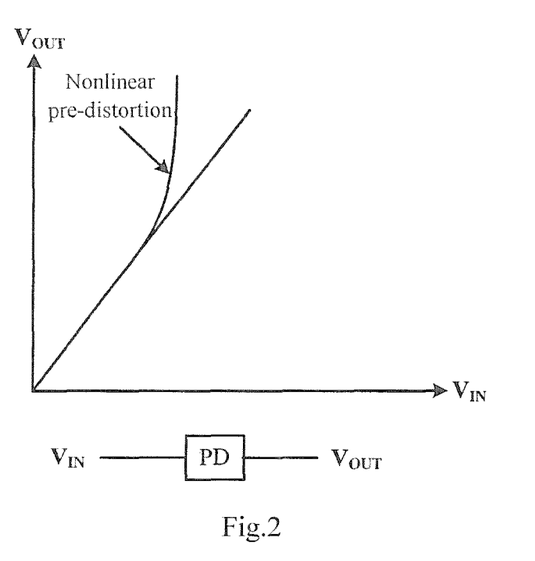
FIG. 2 is a schematic diagram of characteristic of input vs. output signals of a pre-distorter.

And $$Y = aX \tag{5}$$

Where a is a constant, and the equation means that the nonlinearity of the PA has been compensated for so that the input signal will perfectly be amplified linearly. FIG. 2 illustrates a schematic diagram of an input vs. output signal characteristic of the power amplifier pre-distorter canceling out the nonlinear characteristic illustrated in FIG. 1.

The pre-distorter $Q\{\ \}$ can be constructed variously but can generally be written as $Q\alpha i\{\ \}$, that is, a series of parameters $\alpha i$ can be adjusted to change the characteristic of the pre-distorter $Q\{\ \}$ so as to satisfy the equations (4) and (5). A process of acquiring the coefficients $\alpha i$ using an adaptive algorithm is an adaptive convergence process of the pre-distorter.

However, in general, no appropriate coefficient $\alpha i$ of the pre-distorter is known when a transmitter is directly started and the PA starts to operate, and therefore it is typical to set them to some values making the pre-distorter "transparent" (e.g., 0 or 1) so that:

$$Z = Q\{X\} = X \tag{6}$$

Then equivalently the pre-distorter does not work at this time (although it is coupled preceding the PA), so the PA still exhibits strong nonlinearity. Although the adaptive pre-distortion algorithm operates subsequently to search for appropriate $\alpha i$ to satisfy the equations (4) and (5), nonlinearity of the PA has not been fully compensated for in this process so that the spectrum of the output signal of the PA may still include a serious high side lobe and disturb the operation of devices in adjacent channels.

Figure 3:
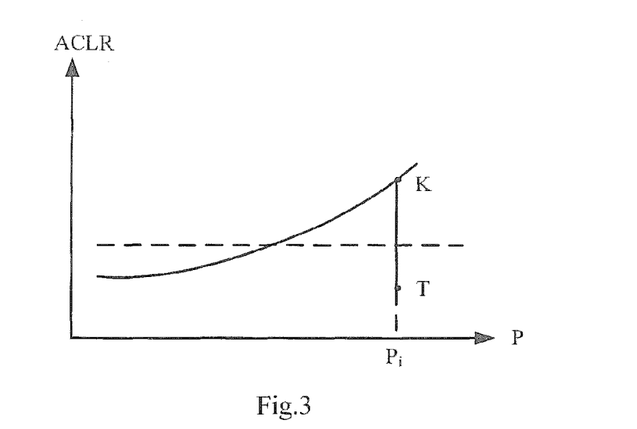
FIG. 3 is a schematic diagram of the relationship between an ACLR and the power of an input signal.

Particularly, the height of the side lobe in the spectrum of the output signal of the PA can be quantitively reflected by the value of an Adjacent Channel Leakage Ratio (ACLR). FIG. 3 illustrates a schematic diagram of the relationship between the ACLR and the power of the input signal, wherein the abscissa represents the power of the input signal. Since the power of the input signal is positively correlated to the amplitude of the input signal in the case of constant current, the schematic diagram can also embody the relationship between the ACLR and the amplitude of the input signal. As can be apparent from FIG. 3, the higher the power of the input signal is, the larger the value of the ACLR will be, which can be reflected in the spectrum of the output signal by a higher side lobe, and correspondingly the larger interference to the devices in adjacent channels will be.

In a practical application, it can be considered that interference of the output signal to the devices in adjacent channels can be neglected, that is, no adjacent channel interference arises, so long as the ACLR value of the output signal meets a specific condition. To this end, it is typical to set thresholds for different frequency intervals in the frequency domain so that the thresholds for the different frequency intervals constitute a complete spectrum emission mask (MASK) as illustrated with the dotted line parallel to the abscissa in FIG. 3, where it can be considered that no adjacent channel interference arises on long as the ACLR value of the output signal is below the MASK value.

Therefore, the convergence process of the pre-distorter can essentially be considered as a process of making the spectrum of the output signal of the PA gradually meet the MASK requirement. For example, the power of the input signal is assumed as $P_i$, i.e. the point $P_i$ illustrated in FIG. 3, and when the transmitter is directly started and the PA starts to operate, the ACLR value is at the point K in FIG. 3, and apparently at this time the spectrum of the output signal does not meet the MASK requirement; and then the adaptive algorithm of the pre-distorter is started to continuously search for appropriate $\alpha i$ until convergence of the algorithm, and this process is embodied in FIG. 3 as the process of the ACLR transitioning gradually from the point K to the point T in the direction perpendicular to the abscissa. Apparently, the spectrum of the output signal meets the MASK requirement upon arrival at the point T, equivalently, an appropriate $\alpha i$ is located for the pre-distorter at this time, and then the pre-distorter can operate always with such parameters to ensure that the spectrum of the output signal will meet the MASK requirement during the operation of the transmitter thereafter.

In summary, whether the side lobe in the spectrum of the output signal of the PA is of a height meeting the requirement can be embodied by whether the ACLR value is below the MASK value, and the magnitude of the ACLR value depends upon the power of the signal input to the PA in addition to the coefficients of the pre-distorter.

Hereupon, an embodiment of the invention firstly provides a power amplification device comprising a power control module, a pre-distortion module and a power amplification module, which are coupled in series. The power control module is configured to perform power adjusting on an input signal, the power amplification module is configured to perform power amplification on the signal subjected to the power adjusting, and the pre-distortion module is configured to compensate for the nonlinear characteristic of the power amplification module. That is, the power of the input signal shall be adjusted in addition to compensation for nonlinearity of the power amplification module prior to power amplification performed on the input signal, and the original input signal to the power amplification device shall be input to the power amplification module for power amplification after being processed by the pre-distortion module and the power control module.

Figure 4:
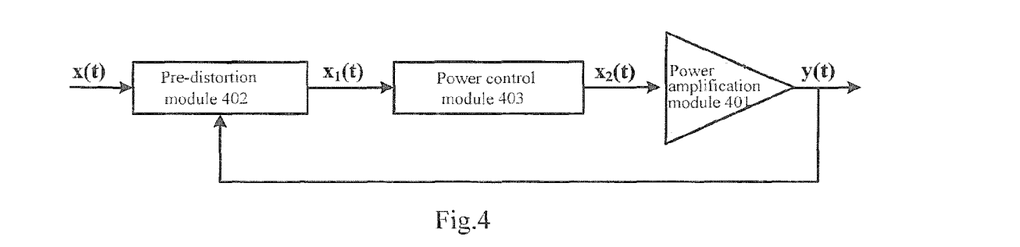
FIG. 4 is a schematic diagram of a power amplification device according to a first embodiment of the invention.
Figure 5:
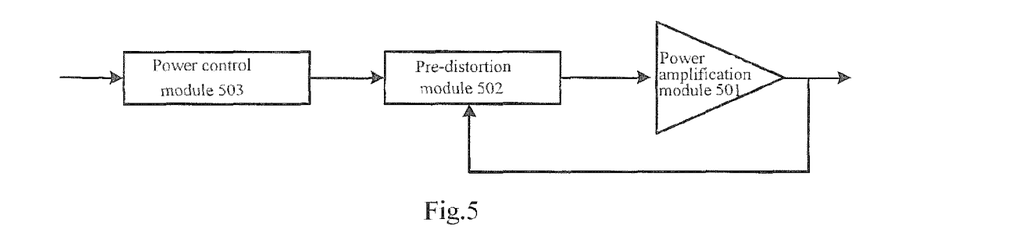
FIG. 5 is a schematic diagram of a power amplification device according to a second embodiment of the invention.

In an embodiment, the power control module 403 can be coupled between the pre-distortion module 402 and the power amplification module 401 in series as illustrated in FIG. 4. In another embodiment, the pre-distortion module 502 can be coupled between the power control module 503 and the power amplification module 501 in series as illustrated in FIG. 5. That is, the pre-distortion module and the power control module can be adjusted in sequence to attain the same effect. This is because the pre-distortion module functions to compensate for nonlinearity of the power amplification module, and thanks to technological advancement, the pre-distortion module generally can operate substantially without changing the power of the signal. For example in FIG. 4, the signal input to the pre-distortion module is $x(t)$, and the signal output from the pre-distortion module is $x_1(\ )$ where $x_1(t)$ is substantially unchanged in power relative to $x(t)$. Therefore, although the signal input to the power control module is $x_1(t)$ and the power control module performs power control on $x_1(t)$, this essentially has the same effect as that of direct power control on $x(t)$ (i.e., the scenario in FIG. 5).

In a practical application, the power control module can perform power control with a power adjusting coefficient. Also since the spectrum may violate the MASK only upon startup, power adjusting can be performed on the input signal in accordance with the power adjusting coefficient only upon startup of the power amplification device.

Figure 6:
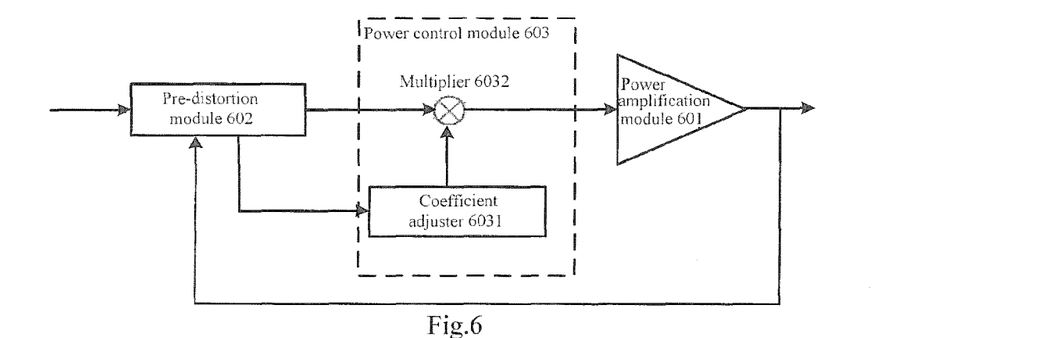
FIG. 6 is a schematic diagram of a power amplification device according to a third embodiment of the invention.

In this case, an embodiment is illustrated in FIG. 6, where the pre-distortion module 602 performs pre-distortion self-adaptive algorithm searching in accordance with the output signal of the power amplification module, performs pre-distortion processing on the input signal based on a searched coefficient and sends a power adjusting notification to the power control module when a convergence condition is met; and the power control module comprises a coefficient adjuster 6031 and a multiplier 6032, where the coefficient adjuster 6031 is configured to produce an initial value of the power adjusting coefficient which is larger than 0 and smaller than 1 when the power amplification device is turned on (the initial value is larger than zero and smaller than 1 (typically close to zero)) and adjust the power adjusting coefficient each time when receiving the power adjusting notification until the power adjusting coefficient is adjusted to 1, and the multiplier 6032 is configured to multiply the received signal by the power adjusting coefficient. The power amplifier 601 is configured to perform power amplification on the received signal.

In an embodiment, the coefficient adjuster 6031 can perform incremental adjusting once on the power adjusting coefficient in the interval of being smaller than or equal to 1 each time when receiving the power adjusting notification until the power adjusting coefficient is adjusted to 1 after a number of times of incremental adjusting. That is, the power control module 603 shall multiply the signal input to the module by a coefficient which has an initial value close to zero upon startup of the power amplification device and which is increased gradually until the coefficient is increased to 1.

Of course, incremental adjusting may not necessarily be performed all the time to adjust the power adjusting coefficient, but other kinds of adjusting may also be possible, so long as it can finally be adjusted to 1 starting from a small value.

Particularly, the power adjusting notification can be a trigger message sent from the pre-distortion module 602, and of course, the power adjusting notification can be sent in other ways.

In the embodiment illustrated in FIG. 6, upon startup of the power amplification device, the power control module 603 can reduce the power of the signal input to the power amplification module 601 to a low value by producing a low initial value of the power adjusting coefficient and adjusting the power of the received signal using the initial value, and since the PA can operate closely to the linear region when the power of the signal input to the PA is low, the spectrum of the output signal of the PA will include a low side lobe; and then the pre-distortion module 602 starts to function, that is, the side lobe still exists in the spectrum of the output signal although it is low, and the pre-distortion module 602 can perform adaptive algorithm searching dependent upon the spectrum of the output signal of the PA, performs pre-distortion processing on the input signal based on a searched coefficient and sends a power adjusting notification to the power control module when a convergence condition is met. The power control module 603 adjusts the power adjusting coefficient once each time when receiving the power adjusting notification sent from the pre-distortion module 602, and then the pre-distortion module 602 performs algorithm searching again, and the power control module 403 adjusts the power adjusting coefficient again until the power adjusting coefficient is adjusted to 1. That is, the power of the signal input to the power amplification module 601 undergoes a process of being adjusted gradually to be equal in power to the original input signal of the transmitter.

Figure 7:
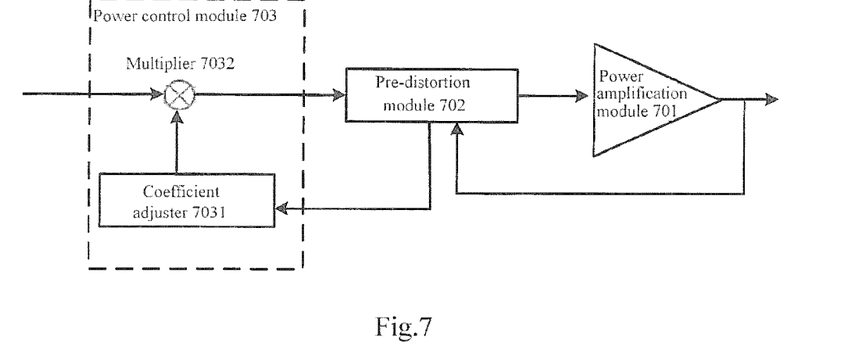
FIG. 7 is a schematic diagram of a power amplification device according to a fourth embodiment of the invention.

Of course, as described above, the power control module and the pre-distortion module can alternatively be connected otherwise in another embodiment of the invention. For example, reference is made to FIG. 7 illustrating a schematic diagram of another power amplification device according to an embodiment of the invention, where the pre-distortion module 702 is coupled between the power control module 703 and the power amplification module 701 in series, and similarly, the power control module 703 can further include the coefficient adjuster 7031 and the multiplier 7032.

Particularly, it is substantially the same as the power amplification device in FIG. 6 except the sequential relationship in which the pre-distortion module and the power control module are connected, and therefore, a repeated description thereof will be omitted here.

It shall be noted that a specific adaptive algorithm used in the pre-distortion module will not be defined in any embodiment of the invention. The convergence condition being met can refer to that the spectrum of the output signal has met a preset requirement upon full convergence of the adaptive algorithm or after the adaptive algorithm has converged to some extent, etc.

It shall further be noted that as described above, since the pre-distortion module operates substantially without influencing the power of the original input signal, the signal output from the multiplier is equivalent to the result of multiplying the original input signal of the transmitter by the power adjusting coefficient. The coefficient R is a small number larger than 0 and smaller than or equal to 1, and therefore the result of multiplication will reduce the power of the signal output from the multiplier 5032 relative to the original input signal and also lower the power of the signal input to the power amplification module, thereby reducing the ACLR of the output signal of the power amplification module. As can be apparent, it can be ensured that the spectrum of the output signal of the power amplification module will meet the MASK requirement upon startup of the transmitter so long as the initial value of the coefficient R is sufficiently small. To this end, the initial value of the coefficient R can take a small number close to 0 in a specific application.

Thereafter, the pre-distortion module searches gradually for $\alpha i$ and performs pre-distortion processing on the input signal based upon the searched coefficient $\alpha i$ so that the ACLR of the output signal of the power amplifier will be reduced gradually until the convergence condition is met with appropriate searched $\alpha i$, and at this time, the pre-distortion module sends a trigger signal to the power control module to indicate to the power control module that the pre-distortion algorithm has met the convergence condition.

When the power control module receives the trigger signal sent from the pre-distortion module, the coefficient adjuster adjusts the power adjusting coefficient and in particular, can perform incremental adjusting on the power adjusting coefficient once each time when receiving the trigger signal from the pre-distortion module, and of course, the incremented power adjusting coefficient will not exceed 1.

That is, after the pre-distortion algorithm has met the convergence condition, the coefficient adjuster can increase the power adjusting coefficient, and at this time the ACLR of the output signal of the power amplification device 501 will also be increased accordingly. It can be ensured that the ACLR of the output signal of the power amplifier will still be below the MASK after the power adjusting coefficient is increased in the case that the current pre-distortion module has already searched for an appropriate coefficient for a preceding status, so long as the power adjusting coefficient has not been incremented to an excessive extent. Then, the pre-distortion module starts the pre-distortion adaptive algorithm searching again and increases the coefficient R after the pre-distortion algorithm meets the convergence condition again, which is repeated until the power adjusting coefficient is increased to 1.

Particularly in the process, the pre-distortion module 502 will perform adaptive algorithm searching for a number of times with the current power adjusting coefficient; or the power control module 503 can adjust the power adjusting coefficient for a number of times with the pre-distortion coefficients resulting from adaptive algorithm searching performed by the pre-distortion module 502 in accordance with the value of the power adjusting coefficient in a preceding status. For example, if the values of the power adjusting coefficient in respective statuses are $R_1$, $R_2$ and $R_3$, where $R_3=1$, and the power of the original input signal is P, then adaptive algorithm searching is performed for the first time in the status that the power of the input signal of the power amplification module 501 is $R_1*P$, and upon convergence of the algorithm, an appropriate coefficient $\alpha_1$ will be searched for this status, and pre-distortion processing will be performed based upon the $\alpha_1$; next the power adjusting coefficient will be increased to $R_2$, and at this time, the power of the input signal of the power amplification module 501 will become $R_2*P$, so the pre-distortion module 502 will start searching from $\alpha_1$, and upon another convergence, an appropriate coefficient $\alpha_2$ will be searched for this status, and pre-distortion processing will be performed based upon $\alpha_2$; and next the power adjusting coefficient will be increased to $R_3=1$, the power of the input signal of the power amplification module 501 will become P, and the pre-distortion module 502 will start searching from $\alpha_2$, and upon still another convergence, an appropriate coefficient $\alpha_3$ will be searched for this status. At this time, since the power adjusting parameter has become 1, no further incremental adjusting will be performed, and at this time the pre-distortion module 502 will keep operating with the coefficient of $\alpha_3$, that is, perform pre-distortion processing on the input signal based upon $\alpha_3$.

That is, it can be ensured that the ACLR value of the output signal of the power amplification module 501 will meet the MASK requirement so long as the power adjusting coefficient is incremented by a controlled step size. This is because a pre-distortion coefficient searched for an input signal will also apply to another input signal so long as the power of the input signals of the power amplification module 501 are sufficiently close to each other; and in the embodiment of the invention, the power of the input signal of the power amplification module 501 is determined by the power adjusting coefficient of the power control module 503, and therefore the pre-distortion coefficient searched by the pre-distortion module 502 for the power adjusting coefficient of $R_1$ will also apply to the power adjusting coefficient of $R_2$ so long as the two power adjusting coefficients $R_1$ and $R_2$ are sufficiently close to each other. As can be apparent, it can be ensured with the power amplification device described above that the spectrum of the output signal will meet the MASK requirement all the time so long as the initial value of the coefficient R is sufficiently low and incremented to a controlled extent. That is, the power amplification device according to the embodiment of the invention offers a basic for attaining the foregoing efficiency.

In a practical application, the pre-distortion module can be implemented with a pre-distorter, and the power amplification module can be implemented with a power amplifier.

For more intuitive understanding of the technical solution according to an embodiment of the invention, the embodiment of the invention will further be introduced below regarding how the ACLR value of the output signal changes with use of the power amplification device according to the embodiment of the invention illustrated in FIG. 6.

Figure 8:
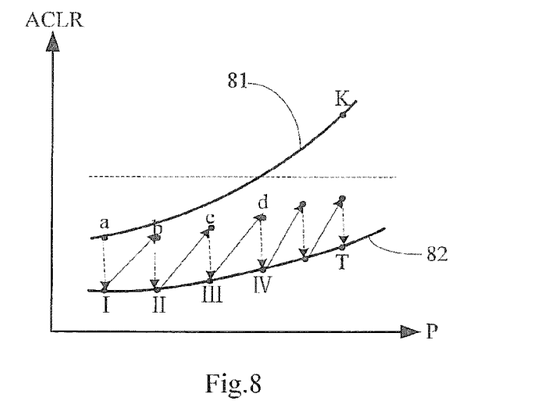
FIG. 8 is a schematic diagram of the relationship between an ACLR and the power of an input signal when the power is amplified using a power amplification device according to an embodiment of the invention.

In FIG. 8, the graph 81 represents a relationship between the power of an input signal and the ACLR of an output signal of a power amplifier without a pre-distorter, and the graph 82 represents a relationship between the power of an input signal and the ACLR of an output signal of the power amplifier upon convergence of a pre-distortion algorithm with a pre-distorter.

If the power of the original input signal of the transmitter is $P_i$, then as described above, if the transmitter is turned on directly, then the ACLR of the output signal of the PA will be at the point K on the graph 81 while violating seriously the MASK, and then the pre-distorter is started, so the ACLR will be reduced gradually to the point T on the graph 82.

With the power amplification device according to the embodiment of the invention, a very small power adjusting coefficient $R_1$ can be taken upon startup of the transmitter, so the ACLR value of the output signal upon startup will be low and assumed at the point a on the graph 81. Then, the pre-distortion module starts operating to update a pre-distortion coefficient in accordance with the pre-distortion algorithm, and upon full convergence (assumed this is a convergence condition), the ACLR value of the output signal of the PA will be at the point I on the graph 82, and the pre-distortion coefficient will stop updating. At this time the coefficient in the pre-distortion module has changed from Coe.0 in a transparent status (with the coefficient of 1 or 0) upon startup to a convergence coefficient of Coe.1. At this time the pre-distortion module can instruct the power control module to adjust the power adjusting coefficient R (for example, to increase the coefficient R), for example, $R=R+\Delta$, where $0<\Delta<1$, so that the increased coefficient is $R_2$. Then the ACLR value of the output signal of the power amplification module rises to the point b. At this time the algorithm of updating the pre-distortion coefficient is started again to search with the initial value of Coe.1 until convergence to Coe.2, and at this time the ACLR value of the output signal will be at the point II. Next the coefficient R is further incremented in value and the pre-distortion coefficient is further updated until the value of the coefficient R is 1 and thus will not change any more, and in such a status, it will be sufficient for the pre-distortion module to further search for an appropriate pre-distortion coefficient.

It shall be noted that when the coefficient R is increased once from the initial value, the ACLR value of the output signal of the PA will not rise to a point on the graph 81 because at this time the pre-distortion coefficient is Coe.1, which means that the pre-distortion module is functioning, that is, after the coefficient R is increased, the pre-distortion module functions on a basis of the result of last convergence instead of starting with the initial value of 0 or 1, so the foregoing result can be attained with cooperation of the pre-distortion module and the power control module. A subsequent process is similar thereto, that is, the ACLR value will be below the graph 81 while incrementing the coefficient R.

Furthermore, since the convergence process and result of the pre-distortion module depends upon the specific output signal of the PA, which in turn depends upon the specific signal input to the PA, the power of which changes with the coefficient R, the coefficient resulting from each convergence in the pre-distortion module also changes constantly. For example, in the foregoing example, when the convergence coefficient is Coe.1, the pre-distortion module operates with $R=R_1$, and at this time the power of the signal input to the PA is $R_1*P_i$, that is, the pre-distortion module performs adaptive algorithm searching resulting in a convergence coefficient of Coe.1 in the case that the power of the input signal of the PA is $R_1*P_i$. Next the power of the input signal of the PA changes $R_2*P_i$ after the coefficient R is increased to $R_2$, so the pre-distortion module will search for an appropriate convergence coefficient again based upon Coe.1, that is, the pre-distortion module performs searching again resulting in a convergence coefficient of Coe.2 in the case that the power of the input signal of the PA is $R_2*P_i$ until the coefficient R is increased to 1 and the power of the input signal of the PA changes to $P_i$, that is, is equal to that of the original input signal of the transmitter, so that the pre-distortion module will search for an appropriate convergence coefficient of Coe.n based upon the convergence coefficient searched for the preceding status when the power of the input signal of the PA is $P_i$. In contrast to doing without a power control module, it takes a longer period of time to derive the convergence coefficient of Coe.n since the transmitter is turned on, but there is a significantly lower probability of the spectrum of the output signal of the PA violating the MASK.

It shall further be noted that only a variation relationship between the input power and the ACLR value is embodied in the schematic diagram illustrated in FIG. 8 without embodying a temporal concept. If the temporal concept is also taken into account, then the ACLR value changes gradually from the point a to the point I, that is, drops gradually to the point I but changes dramatically from the point I to the point b, that is, jumps directly from the point I to the point b. A subsequent process is similar thereto, that is, the ACLR value changes gradually from the point b to the point II, further dramatically from the point II to the point c, then gradually from the point c to the point III and further dramatically from the point III to the point d until the coefficient R increments to 1. Particularly, the gradual change is attributable to updating of the pre-distortion coefficient, and the dramatic change is attributable to incrementing of the power adjusting coefficient R.

In a practical application, the coefficient adjuster can produce and increase the power adjusting coefficient from a pre-stored set of parameters incremented gradually from an initial value to 1. That is, a set of parameters incremented gradually from a very small value to 1 can be acquired and stored in advance. The coefficient adjuster can retrieve the value of the coefficient R in respective statuses directly from the set of pre-stored parameters. For example, a first one in the set of parameters is retrieved as an initial value of the coefficient R upon startup of the transmitter, and for the incremented coefficient R, a subsequent value is retrieved from the set of parameters until the coefficient R is 1. Apparently, the complexity of online processing in the coefficient adjuster can be lowered in this approach due to direct retrieval from the known parameters.

Alternatively, the coefficient adjuster can produce an initial value of the power adjusting coefficient from a pre-stored initial value and increment the power adjusting coefficient by a pre-stored step size. That is, an initial value and a step size $\Delta$ of the power adjusting coefficient R are pre-stored, and thus the pre-stored initial value is determined directly as an initial value of the power adjusting coefficient of the coefficient adjuster upon startup of the transmitter, and the power adjusting coefficient is incremented by adding the pre-stored step size $\Delta$ to the current power adjusting coefficient. Particularly, the step size $\Delta$ may take a constant or inconstant value. In the case of an inconstant value, a succeeding step size $\Delta$ can be smaller than or equal to a preceding one, that is, a step size $\Delta$ closer to the MASK value can take a smaller value. Particularly, the pre-stored initial value and step size can be derived empirically.

As described above, the pre-distortion module will start adaptive algorithm searching, for a number of times, where adaptive algorithm searching can be started in a variety of ways. For example, in an embodiment illustrated in FIG. 9, the power amplification device can further include a spectrum detecting module 904 configured to determine whether the output signal of the power amplification module 901 matches a preset spectrum condition, and the pre-distortion module 902 starts or restarts said pre-distortion self-adaptive algorithm searching when the determination result is that the output signal of the power amplification module 901 does not match the preset spectrum condition. That is, the pre-distortion module 902 can start self-adaptive algorithm searching automatically in response to the determination result of the spectrum detecting module 904.

Figure 9:
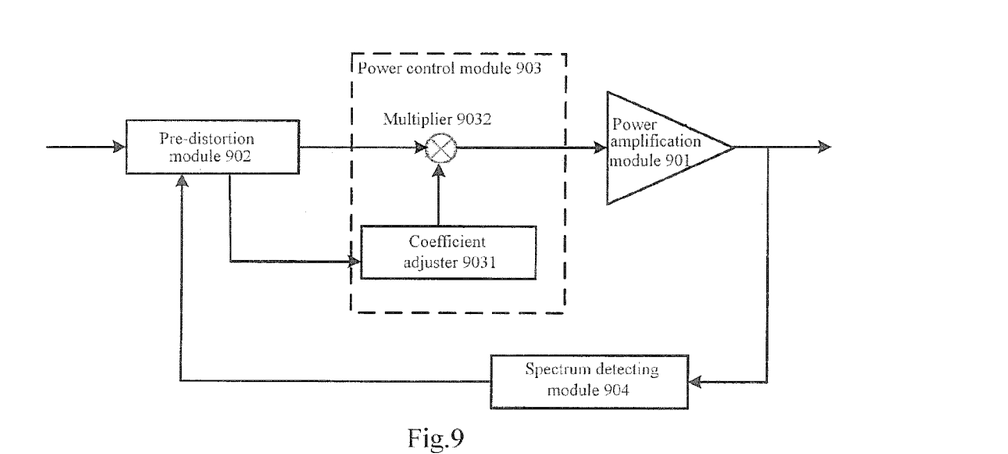
FIG. 9 is a schematic diagram of a power amplification device according to a fifth embodiment of the invention.

For example, whenever the spectrum detecting module 904 detects an output signal of the power amplification module 901 and the output signal does not match the preset spectrum condition after the transmitter is turned on, the pre-distortion module 902 starts self-adaptive algorithm searching automatically and sends a power adjusting notification when the convergence condition is met; and then the power adjusting module 903 will boost the power of the signal input to the power amplification module 901, and accordingly the output signal of the power amplification module 901 will change, which can be reflected by the side lobe of the spectrum jumping to a height of a higher value (of course, the side lobe jumping to the height can meet the spectrum condition, i.e. the ACLR value is lower than the MASK, due to the coefficient α1 searched by the pre-distortion module 902 for the unadjusted status). At this time the pre-distortion module 902 can know this from the output result of the spectrum detecting module 904 and find that the currently searched coefficient α1 is not appropriate any longer and then restart adaptive algorithm searching and again send a power adjusting notification to the power control module 903 when the convergence condition is met. This process can be repeated.

Figure 10:
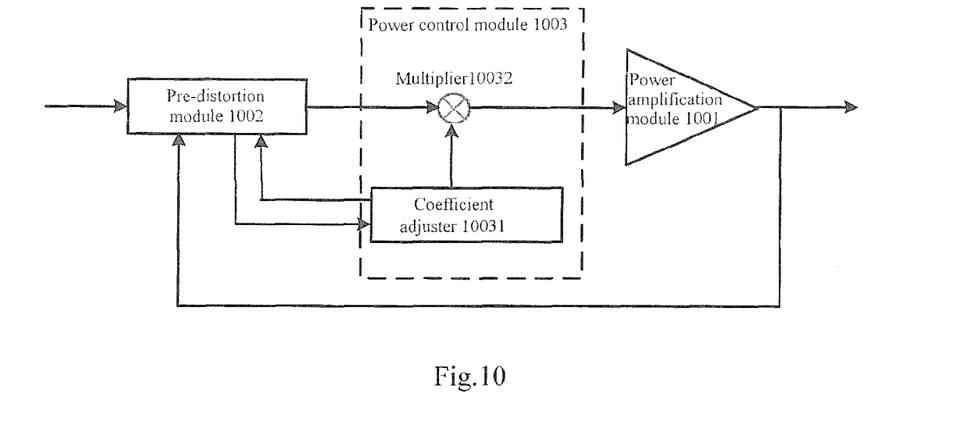
FIG. 10 is a schematic diagram of a power amplification device according to a sixth embodiment of the invention.

Of course, in another embodiment illustrated in FIG. 10, the power adjusting module 1003 can send a search starting notification to the pre-distortion module 1002 after adjusting the power adjusting coefficient each time. That is, whether the pre-distortion module 1002 starts adaptive algorithm searching is controlled by the power adjusting module 1003. In other words, the pre-distortion module 1002 can start adaptive algorithm searching only upon reception of the starting signal from the power adjusting, module 1003. Of course, the pre-distortion module 1002 performs adaptive algorithm searching in response to the output signal of the power amplification module 1001 once new adaptive algorithm searching is started.

In summary, some data including the coefficient for adjusting every time or the initial value and the step size of the coefficient will be pre-stored for power adjusting on the signal prior to power amplification. In an embodiment of the invention, adjusting of the power adjusting coefficient can be controlled online dependent upon an actual situation so as to avoid an influence due to an environmental factor, aging of the device or other factors.

Figure 11:
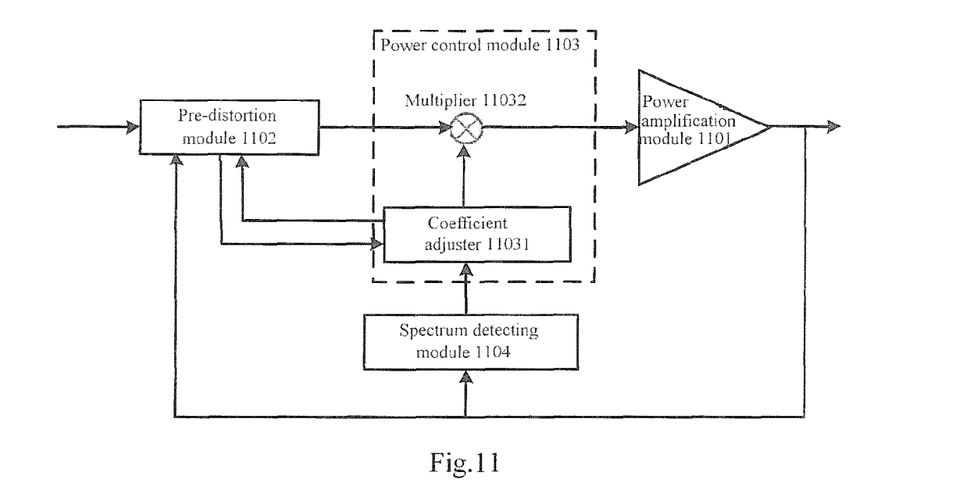
FIG. 11 is a schematic diagram of a power amplification device according to a seventh embodiment of the invention.

In this regard, the power amplification device according to an embodiment of the invention can further comprise a spectrum detecting module and the other respective modules are connected as illustrated in FIG. 6. Referring to FIG. 11, the feedback module 1104 is configured to determine whether the signal output from the power amplification module 1101 meets a preset spectrum condition and to feed the determination result back to the power control module 1103, where the preset spectrum condition can be the ACLR value of the output signal being smaller than the MASK.

Correspondingly, the coefficient adjuster 11031 can further be configured to reduce the current value of the power adjusting coefficient and the step size for incremental adjusting when the determination result of the spectrum detecting module is that the signal output from the power amplification module 1101 does not meet the preset spectrum condition until the determination result of the spectrum detecting module 1104 is that the signal output from the power amplification module 1101 meets the preset spectrum condition and to send a starting notification to the pre-distortion module 1102 to start or restart the pre-distortion module 1102 to perform pre-distortion adaptive algorithm searching. That is, the power adjusting module 1103 may not start the pre-distortion module 1102 to perform adaptive algorithm searching again immediately after adjusting the power adjusting coefficient each time, but instead can, after adjusting the power adjusting coefficient each time, firstly determine whether the ACLR value of the output signal of the power amplification module 1101 exceeds the MASK, and if not so, then it can start the pre-distortion module 1102 to perform adaptive algorithm searching again; otherwise, it can reduce the current power adjusting coefficient and the step size for power adjusting and determine again through the spectrum detecting module 1104 whether the ACLR value of the output signal of the power amplification module 1101 exceeds the MASK until the MASK is not violated any more.

For example, upon startup of the transmitter, the coefficient adjuster 11031 of the power control module 1103 firstly starts operating with the pre-stored initial value, and the spectrum detecting module 1104 can determine whether the ACLR value of the output signal of the power amplification module 1101 is below the MASK at this time, and if so, then the power control module 1103 can trigger the pre-distortion module 1102 to start pre-distortion adaptive algorithm searching; otherwise, the coefficient adjuster 11031 can reduce the initial value of the coefficient R, for example, by adjusting the initial value of the coefficient R to R−β, where 0<β<R, and starting the pre-distortion module 1102 again to start pre-distortion processing when the ACLR value of the output signal is below the MASK.

Then during adjusting of the coefficient R, if the spectrum detecting module 1104 finds that the ACLR value of the output signal is above the MASK at a time, the coefficient adjuster 11031 can firstly reduce the step size Δ and the current value of the power adjusting coefficient, and then the spectrum detecting module 1104 can detect the spectrum of the output signal; and at the next time of further incrementing the coefficient R, the current coefficient R can be increased by the reduced step size Δ, that is, Δ=γΔ, where 0<γ<1 and 0<Δ<1, and then R=R−Δ. Otherwise, the coefficient R can be incremented by the preceding step size.

For example, assumed Δ=0.1 and γ=−0.5, and then the coefficient R is incremented once from 0.6 to 0.7; and at this time, the spectrum detecting module 1104 finds that the ACLR value of the output signal is above the MASK at this time, and then the step size Δ changes to 0.1*0.5=0.05, and the coefficient R is reduced from 0.7 to 0.7−0.05=0.65; then the spectrum detecting module 1104 determines whether the ACLR value of the output signal is still above the MASK, and if not so, then the coefficient adjuster 11031 triggers the pre-distortion module 1102 to perform adaptive algorithm searching with the coefficient R of 0.65 and to perform pre-distortion on the received signal based upon a searched coefficient; and the coefficient R is incremented from 0.65 to 0.7 upon convergence of the algorithm; otherwise, if the ACLR value of the output signal is still above the MASK, then Δ changes to 0.05*0.05=0.025, and the coefficient R is reduced from 0.65 to 0.65−0.025=0.625, and so on. Of course, this is merely an embodiment, and other embodiments will not be limited thereto.

In a practical application, a "protecting MASK" which is more strict than the normal MASK can further be set in the spectrum detecting module 1104 in order to ensure that the ACLR value of the output signal will not violate the MASK throughout the process. The current value of the power adjusting coefficient R, i.e., the step size, will be modified once violation of the protecting MASK is found during production or adjusting of the power adjusting coefficient R. A specific modification method can be the same as described above, and a repeated description thereof will be omitted here.

Apparently in the foregoing online adjusting solution, since the power adjusting coefficient and the step size can be adjusted in response to a feedback from the feedback module, the power amplification device according to the embodiment of the invention will be insusceptible to an environmental factor, e.g., temperature, humidity, etc., aging of the device or other factors, thereby improving the effectiveness of the device.

Furthermore such a scenario is also possible that after the coefficient adjuster 11031 starts the pre-distortion module 1102 to perform algorithm searching and the algorithm of the pre-distortion module 1102 converges, the ACLR value may not fall onto or around the graph 82 illustrated in FIG. 8. At this time, the pre-distortion module 1102 can be instructed to restart adaptive algorithm searching. If the ACLR value still fails to fall onto or around the graph 82 illustrated in FIG. 8 after searching has been started for a number of times, the coefficient adjuster 11031 reduces the current coefficient R and then starts pre-distortion module 1102 to restart adaptive algorithm searching and to perform pre-distortion processing with a searched coefficient until the pre-distortion algorithm converges and the ACLR value falls onto or around the graph 82 illustrated in FIG. 8. Of course, the coefficient R will be reduced to a smaller extent than the extent to which the coefficient is increased.

It shall be noted that ACLR values at respective points on the graph 82 illustrated in FIG. 8 can be pre-acquired experimentally or otherwise in order to determine whether the ACLR value of the output signal falls onto or around the graph 82. When adaptive algorithm searching is performed with specific power of the input signal, after the algorithm converges, an actual value of the ACLR of the output signal is firstly acquired and then compared with the pre-acquired ACLR value corresponding to the power, and if the difference thereof conies into a preset range, it indicates that the ACLR value falls onto or around the graph 82 illustrated in FIG. 8.

It shall further be noted that algorithm searching will be restarted without changing the power adjusting coefficient if it is known from the feedback signal that the ACLR value of the signal after convergence does not meet the requirement after the pre-distortion module performs algorithm searching once with the power adjusting coefficient changed to a specific value in the foregoing scenario. Of course in this process, the power adjusting coefficient is not changed in value (that is, the signal input to the power amplification module is not changed in power), but there may be a varying convergence result each time when algorithm searching is restarted. This is decided by the adaptive algorithm per se because the adaptive algorithm per se is a multi-variable optimization process coming to a specific status at a specific probability. Therefore, there may be a varying result each time when algorithm searching is restarted even in the same environment.

The power amplification device according to the embodiment of the invention has been introduced in details as above. Pre-distortion processing and power control can be combined in the power amplification device so that upon startup of the transmitter, the output signal of the power amplifier can be provided with a spectrum including a low side lobe due to power control, thus facilitating the transmitter with a spectrum including a low side lobe even upon startup.

Figure 12:
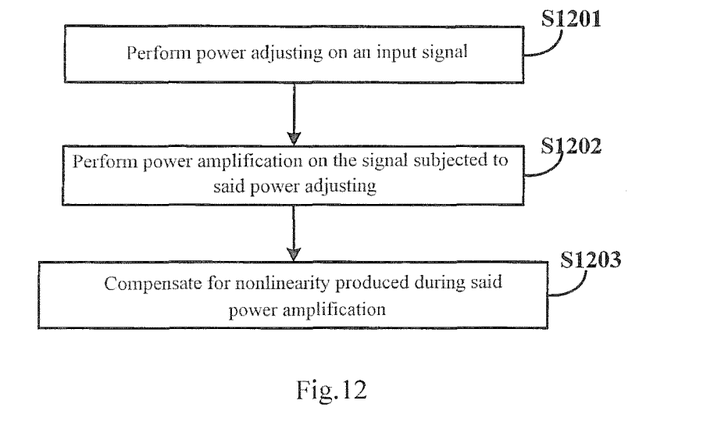
FIG. 12 is a flow chart of a power amplification method according to an embodiment of the invention.

Furthermore, an embodiment of the invention further provides a power amplification method, and FIG. 12 illustrates a flow chart of the power amplification method according to the embodiment of the invention.

As illustrated in FIG. 12, firstly power adjusting is performed on an input signal in the step S1201 of the power amplification method according to the present embodiment. Particularly, the input signal refers to a signal input to the power amplification device, and as described above, power adjusting is performed directly or indirectly on the signal input to the power amplification device regardless of whether power adjusting or pre-distortion processing is performed firstly. Next, power amplification is performed on the signal subject to power adjusting in the step S1202; and of course, the step S1203 is further performed during power amplification to compensate for nonlinearity due to power amplification.

Particularly during compensation for nonlinearity, pre-distortion adaptive algorithm searching can be performed on the signal subjected to power amplification, and a power adjusting notification can be sent when a convergence condition is met; and correspondingly, power control can be performed on the signal prior to power amplification in such a way that an initial value of a power adjusting coefficient larger than 0 and smaller than 1 is produced upon startup of the power amplification device and the power adjusting coefficient is adjusted each time when receiving the power adjusting notification until the power adjusting coefficient is adjusted to 1; and the input signal is multiplied by the power adjusting coefficient. For example, the signal prior to power amplification can be adjusted in power from startup of the transmitter; and an initial value of the power adjusting coefficient larger than zero and smaller than 1 can be produced upon startup of the transmitter, and the power adjusting coefficient can be incrementally adjusted once in an interval of being smaller than or equal to 1 each time when receiving the power adjusting notification until the power adjusting coefficient is adjusted to 1 after being incrementally adjusted for a number of times.

Particularly, the power adjusting coefficient can be produced and incremented from a pre-stored set of parameters incremented gradually to 1. Alternatively, an initial value of the power adjusting coefficient can be produced from a pre-stored initial value and the power adjusting coefficient can be incremented by a pre-stored step size.

In an embodiment, pre-distortion adaptive algorithm searching can be started or restarted by determining whether the signal subjected to power amplification meets a preset spectrum condition. Alternatively, pre-distortion adaptive algorithm searching can be started or restarted after adjusting the power adjusting coefficient.

Figure 13:
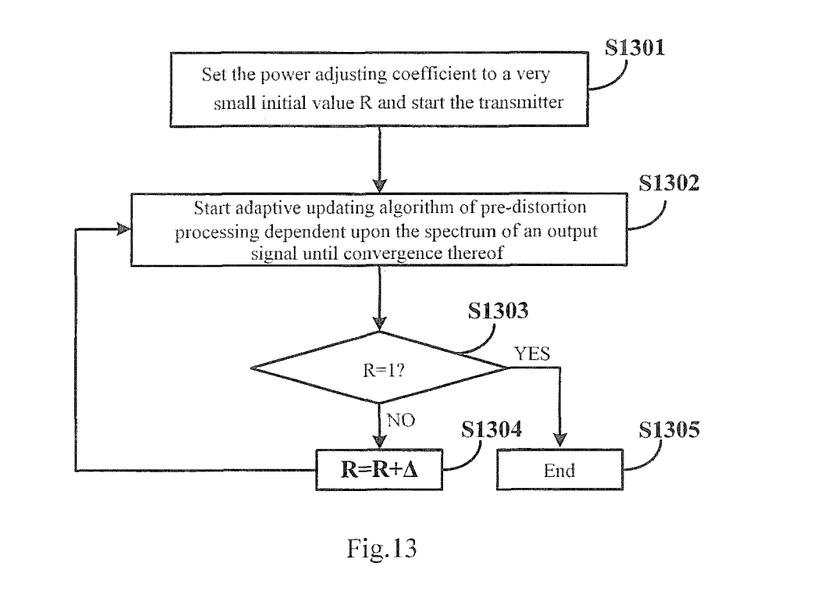
FIG. 13 is another flow chart of a power amplification method according to an embodiment of the invention.

Referring to FIG. 13, pre-distortion adaptive algorithm searching can be started or restarted as follows by determining whether the signal subjected to power amplification meets a preset spectrum condition.

Firstly in the step S1301, the power adjusting coefficient is set to a very small initial value R (e.g., close to zero) and the transmitter is started.

Then in the step S1302, the pre-distortion module can start adaptive algorithm searching of pre-distortion processing dependent upon a spectrum of an output signal until the convergence condition is met; and in the step S1303, it is determined whether the coefficient R has been increased to 1, and if so, the flow goes to the step S1305; otherwise, the flow goes to the step S1304.

In the step S1304, a coefficient adjuster can increase the coefficient R and return to the step S1302, that is, the pre-distortion module can restart adaptive algorithm searching of pre-distortion processing dependent upon the spectrum of the output signal (for example, upon detection of a dramatic change of the ACLR value of the output signal). The flow ends in the step S1305.

Furthermore, the power adjusting coefficient and the step size thereof can be adjusted online dependent upon the spectrum of the output signal. Specifically, it can be determined whether the signal subject to power amplification meets the preset spectrum condition; and when the determination result is that the signal subjected to power amplification does not meet the preset spectrum condition, the current value of the power adjusting coefficient and the step size for adjusting thereof can be reduced until the preset spectrum condition is met, and then pre-distortion adaptive algorithm searching can be started or restarted. In this online adjusting solution, the power amplification method will be insusceptible to an environmental factor, e.g., temperature, humidity, etc., aging of the device or other factors.

Particularly, the preset spectrum condition includes an Adjacent Channel Leakage Ratio (ACLR) of the signal subjected to power amplification being below than a preset threshold. The threshold may be a spectrum emission mask MASK or a protecting threshold below the MASK.

Figure 14:
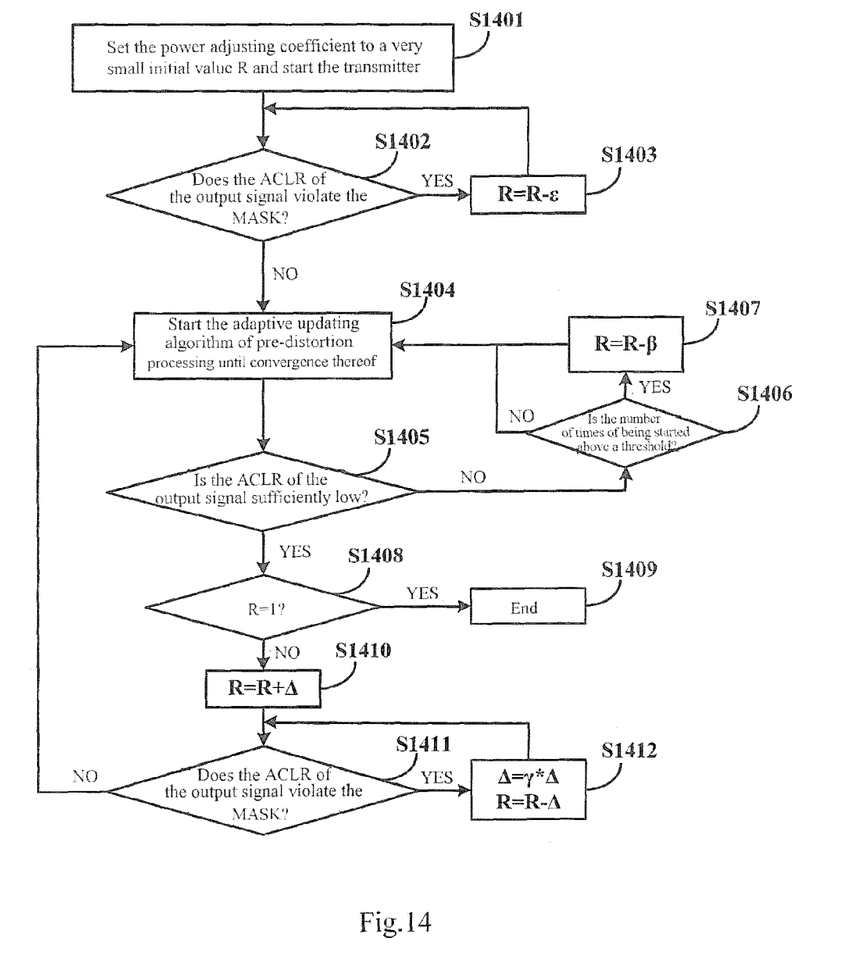
FIG. 14 is a further flow chart of a power amplification method according to an embodiment of the invention.

In a practical application, the foregoing operations can be performed with online adjusting as described above by the power amplification device illustrated in FIG. 11 according to the flow chart illustrated in FIG. 14.

Firstly in the step S1401, the power adjusting coefficient is set to a very small initial value R (e.g., close to zero) and the transmitter is started so that the signal input to the power amplification module can be reduced in power, and it can be ensured that the spectrum of the output signal will not violate the MASK even if the pre-distortion module is inoperative.

Next, in order to ensure that the ACLR value of the output signal will not violate the MASK, it is checked in the step S1402 whether the ACLR of the output signal violates the MASK, and if so, then the flow goes to the step S1403; otherwise, the flow goes to the step S1404. Particularly in the step S1403, the initial value is reduced, for example, R=R−ϵ, where ϵ<R, and then the flow goes to the step S1402 where it is checked whether the ACLR of the output signal violates the MASK.

In the step S1404, the pre-distortion adaptive algorithm is started for updating until the convergence condition (e.g., full convergence or convergence to a specific status) is met.

Next in the step S1405, it is checked whether the ACLR of the output signal is sufficiently low, and if so, then the flow goes to the step S1408; otherwise, the flow goes to the step S1406. In the step S1406, it is checked whether the number of times that the algorithm has been started for has reached a preset threshold, and if not so, the flow jumps to the step S1404 of restarting the adaptive updating algorithm of pre-distortion processing; otherwise, the flow goes to the step S1407 of reducing the coefficient R, R=R−β, where β<R, and the flow further jumps to S1404.

That is, after the pre-distortion algorithm converges, if the ACLR value does not fall around the graph 82 illustrated in FIG. 8, pre-distortion processing can be restarted. If the ACLR value still fails to fall around the graph 82 illustrated in FIG. 8 after pre-distortion processing has been started for a number of times, the current coefficient R is reduced and then pre-distortion processing is restarted until the pre-distortion algorithm converges and the ACLR value falls around the graph 82 illustrated in FIG. 8. Of course, the coefficient R will be reduced to a smaller extent than the extent to which the coefficient is increased. Particularly, ACLR values at respective points on the graph 82 illustrated in FIG. 8 can be pre-acquired experimentally or otherwise in order to determine whether the ACLR value of the output signal falls onto or around the graph 82 illustrated in FIG. 8. After the algorithm converges when adaptive algorithm searching is performed with specific power of the input signal, an actual value of the ACLR of the output signal is firstly acquired and then compared with the pre-acquired ACLR value corresponding to the power, and if the difference thereof comes into a preset range, it indicates that the ACLR value falls onto or around the graph 82 illustrated in FIG. 8.

In the step S1408, it is checked whether the coefficient R has been increased to 1 at this time; and if so, the flow goes to step S1409; otherwise, the flow goes to step S1410, and the flow ends in the step S1409.

In the step S1410, the coefficient R is increased, e.g., R=R+Δ, where 0<Δ<1.

Next in the step S1411, it is checked whether the ACLR of the output signal violates the MASK, and if so, the flow goes to the step S1412; otherwise, the flow returns to the S1404. In the step S1412, firstly the step size and then the current value of the coefficient R are reduced, e.g., Δ=γ*Δ, where 0<γ<1, and R=R−Δ. That is, after the coefficient R is increased once, it is determined whether the step size for increasing is too large, and if so, then the step size is reduced to ensure that the output signal will not violate the MASK.

The steps in the foregoing power amplification method are similar to processing in the respective components included in the power amplification device, and for those details thereof which have not been described, reference can be made to the foregoing description of the power amplification device.

Furthermore, an embodiment of the invention further provides a method for acquiring a power adjusting coefficient by producing and incrementing the coefficient R by pre-storing a set of parameters incremented gradually to 1 as described above, and reference is made to FIG. 15 illustrating a flow chart of the method for acquiring a power adjusting coefficient according to the embodiment of the invention.

Figure 15:
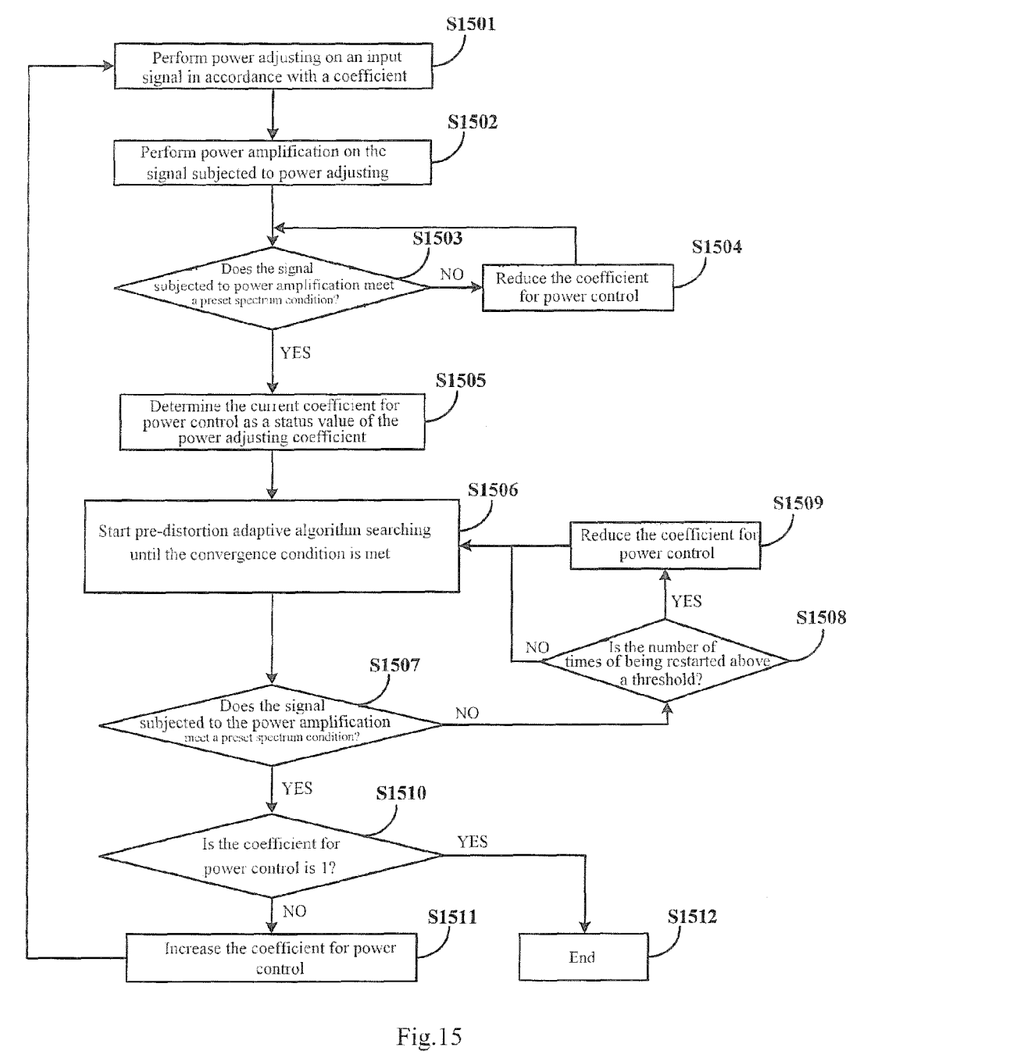
FIG. 15 is a flow chart of a method for acquiring a power adjusting coefficient according to an embodiment of the invention.

As illustrated in FIG. 15, in the method for acquiring a power adjusting coefficient according to the present embodiment of the invention, firstly power adjusting is performed on an input signal in accordance with a coefficient in the step S1501. For example, power control on the signal prior to power amplification can be started with a preset value being the coefficient of power control upon startup of the transmitter, where the preset value is larger than zero and smaller than 1.

Next in the step S1502, power amplification is performed on the signal subjected to power adjusting.

Then in the step S1503, it is determined whether the signal subjected to power amplification meets a preset first spectrum condition, and if so, the flow goes to step S1505; otherwise, the flow goes to step S1504 of reducing the coefficient, and the flow returns to the step S1503 of continuing to determine whether the signal subjected to power amplification meets the preset spectrum condition until the signal subjected to power amplification meets the preset spectrum condition, and then the flow goes to the step S1505. Particularly, the first spectrum condition can be the ACLR value of an output signal not exceeding an MASK or a protecting MASK.

In the step S1505, the coefficient is determined as a status value of the power adjusting coefficient.

Next in step S1506, pre-distortion adaptive algorithm searching is started with the currently determined status value of the power adjusting coefficient being a coefficient of power control.

Then in step S1507, it is determined whether the signal subjected to power amplification meets a preset second spectrum condition when a convergence condition is met, and if so, the flow goes to step S1510; otherwise, the flow goes to step S1508 where it is determined whether the number of times searching has been restarted for exceeds a preset threshold (e.g., 5), and if not so, the flow returns to the step S1506 of restarting pre-distortion adaptive algorithm searching; otherwise, the flow goes to the step S1509 of reducing the coefficient for power control and then the step S1506. Of course, the coefficient R shall be reduced to a smaller extent than the extent to which the coefficient is increased.

Particularly, the second spectrum condition can be an Adjacent Channel Leakage Ratio (ACLR) of the signal subjected to power amplification being in a preset range, for example, whether the ACLR of the output signal falls onto or around the graph 82 illustrated in FIG. 8. That is, with the foregoing steps S1507-S1509, it can further be determined whether the ACLR of the output signal falls onto or around the graph 82 illustrated in FIG. 8 when the pre-distortion algorithm converges, and if not so, pre-distortion processing can be restarted; and if the ACLR of the output signal has not fallen around the graph 82 illustrated in FIG. 8 after searching has been restarted for a number of times, the current coefficient used for power control can be reduced, and pre-distorting processing can be restarted until the ACLR of the output signal falls onto or around the graph 82 illustrated in FIG. 8, and the coefficient at the corresponding moment of time can be determined as a status value of the power adjusting coefficient. Of course, the steps S1507-S1509 can be omitted, that is, the flow can go directly from the step S1506 through to the step S1510, in another embodiment. Particularly, ACLR values at respective points on the graph 82 illustrated in FIG. 8 can be pre-acquired experimentally or otherwise in order to determine whether the ACLR value of the output signal falls onto or around the graph 82. After the algorithm converges when adaptive algorithm searching is performed with specific power of the input signal, an actual value of the ACLR of the output signal is firstly acquired and then compared with the pre-acquired ACLR value corresponding to the power, and if the difference thereof comes into a preset range, it indicates that the ACLR value falls onto or around the graph 82 illustrated in FIG. 8.

In the step S1510, it is determined whether the coefficient for power control is 1, and if so, the flow goes to step S1512 where the flow ends (that is, until the coefficient is increased to 1); otherwise, the flow goes to S1511.

In the step S1511, the coefficient for power control is increased, and the flow returns to the step S1501 of performing power adjusting on the input signal with the coefficient and continues with determining whether the signal subjected to power amplification meets the preset spectrum condition, and if not so, the coefficient for power control is reduced until the signal subjected to power amplification meets the preset spectrum condition.

In the foregoing acquisition process, the determined values $R_i$ (i=0, 1, 2 ... N, where N is a positive integer) of the power adjusting coefficient in respective statuses can be recorded, where $R_N=1$.

In a practical application, the determined values in respective statuses can be stored sequentially in the coefficient adjustor, and thus the power adjusting coefficient R can be produced or incremented in the following process.

Firstly, the transmitter is started, and the coefficient adjuster produces the coefficient R with an initial value of R0; then the coefficient adjuster issues an instruction enabling pre-distortion adaptive algorithm searching to be started until convergence thereof; and it is checked whether a value of Ri is equal to 1 while maintaining the current pre-distortion coefficient, and if so, the flow ends: otherwise, the power adjusting coefficient is incremented to the new value of Ri.

It shall further be noted that the foregoing series of processes and devices can also be implemented by software and/or firmware. In the case of being implemented by software and/or firmware, program constituting the software can be installed onto a computer with a dedicated hardware structure from a storage medium or over a network, e.g., a general-purpose personal computer 700 illustrated in FIG. 16, where the computer with various program installed thereon can perform various functions.

Figure 16:
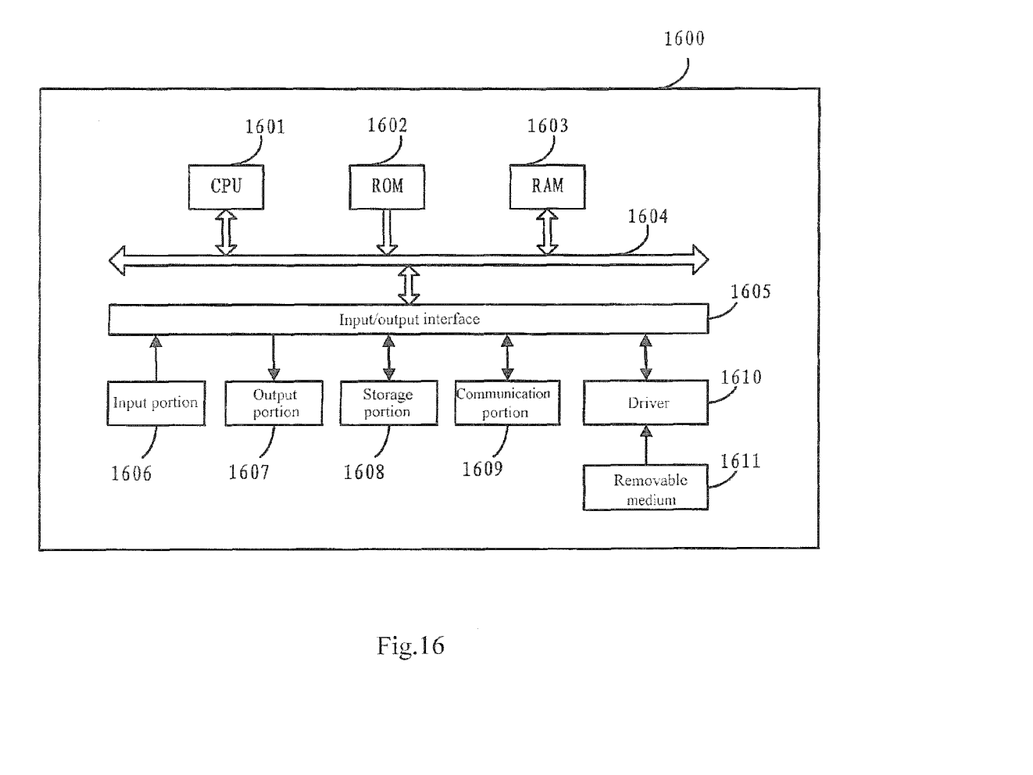
FIG. 16 is a block diagram illustrating an illustrative structure of a personal computer as an information processing device used in an embodiment of the invention.

In FIG. 16, a Central Processing Unit (CPU) 1601 performs various processes in accordance with programs stored in a Read Only Memory (ROM) 1602 or loaded from a storage portion 1608 onto a Random Access Memory (RAM) 1603. Data required for the various processes, etc., performed in the CPU 1601 can also be stored in the RAM 1603 as necessary.

The CPU 1601, the ROM 1602 and the RAM 1603 are connected with each other via a bus 1604 to which an input/output interface 1605 is also connected.

The following components are connected to the input/output interface 1605: an input portion 1606 including a keyboard, mouse, etc.; an output portion 1607 including a display, e.g., a Cathode Ray Tube (CRT), a Liquid Crystal Display (LCD), etc., a speaker, etc.; a storage portion 1608 including a hard disk, etc.; and a communication portion 1609 including a network interface card, e.g., an LAN card, an MODEM, etc. The communication portion 1609 performs a communication process over a network, e.g., the Internet, etc.

A driver 1610 is also connected to the input/output interface 1605 as needed. A removable medium 1611, e.g., a magnetic disk, an optical disk, a magnetic-optical disk, a semiconductor memory, etc., is installed into the driver 1610 as needed so that computer program read therefrom is installed into the storage portion 1608 as needed.

In the case of performing the foregoing series of processes in software, program constituting the software is installed from the network, e.g., the Internet, etc., or a storage medium, e.g., the removable medium 1611, etc.

Those skilled in the art shall appreciate that the storage medium will not be limited to the removable medium 1611 illustrated in FIG. 16 in which the program is stored and which is distributed separately from the device to provide a user with the program. Examples of the removable medium 1611 include a magnetic disk (including a Floppy Disk (a registered trademark)), an optical disk (including a Compact Disk-Read Only Memory (CD-ROM) and a Digital Versatile Disk (DVD)), a magnetic-optical disk (including a Mini Disk (MD) (a registered trademark)) and a semiconductor memory. Alternatively, the storage medium can be the ROM 1602, a hard disk included in the storage portion 1608, etc., have program stored therein and be distributed together with a device including the storage medium to a user.

It shall further be noted that the steps of performing the foregoing series of processes can naturally be performed in a temporal sequence in the order as described but not necessarily be performed in a temporal sequence. Some of the steps can be performed in parallel or independently from each other.

Although the invention and the advantages thereof have been described in detail, it shall be appreciated that various changes, substitutions and variations can be made without departing from the spirit and scope of the invention as defined in the appended claims. Moreover, the terms "comprise", "include" or any other variant in the embodiments of the invention is intended to encompass nonexclusive including so that a process, method, article or device including a series of elements includes those elements and one or more other elements which are not listed explicitly or an element(s) inherent in the process, method, article or device. Unless stated otherwise, an element being defined in a sentence "include a(n) . . . " will not exclude presence of an additional identical element(s) in the process, method, article or device including the element.

The invention claimed is:

1. A power amplification device, comprising:
a power control module configured to perform power adjusting on an input signal;
a power amplification module configured to perform power amplification on the signal subjected to the power adjusting by the power control module; and
a pre-distortion module configured to compensate for nonlinear characteristic of the power amplification module;
wherein said power control module is coupled between said pre-distortion module and said power amplification module in series;
alternatively, said pre-distortion module is coupled between said power control module and said power amplification module in series;
wherein said power control module performs power adjusting on the input signal according to a power adjusting coefficient only upon startup of said power amplification device;
wherein said pre-distortion module performs pre-distortion self-adaptive algorithm searching in accordance with an output signal of said power amplification module, performs pre-distortion processing on the input signal based on a searched coefficient, and sends a power adjusting notification to said power control module when a convergence condition is met; and
wherein said power control module comprises:
a coefficient adjuster configured to produce an initial value of the power adjusting coefficient that is larger than 0 and smaller than 1 when said power amplification device is turned on, and to adjust said power adjusting coefficient each time when receiving the power adjusting notification until said power adjusting coefficient is adjusted to 1; and
a multiplier configured to multiply the received signal by said power adjusting coefficient.

2. The power amplification device according to claim 1, wherein said coefficient adjuster produces the initial value of said power adjusting coefficient and adjusts said power adjusting coefficient, in accordance with a set of parameters gradually increasing from the initial value to 1 stored in advance.

3. The power amplification device according to claim 1, wherein said coefficient adjuster produces the initial value of said power adjusting coefficient according to the initial value stored in advance, and performs incremental adjusting on said power adjusting coefficient utilizing a step size stored in advance.

4. The power amplification device according to claim 1, further comprising:
a spectrum detecting module configured to determine whether the output signal of said power amplification module matches a preset spectrum condition; and
wherein, said pre-distortion module starts or restarts said pre-distortion self-adaptive algorithm searching, when the determination result of the spectrum detecting module is that the output signal of said power amplification module does not match the preset spectrum condition.

5. The power amplification device according to claim 1, further comprising:
a spectrum detecting module configured to determine whether the output signal of said power amplification module matches a preset spectrum condition; and
wherein, when the determination result of the spectrum detecting module is that the output signal of said power amplification module does not match the preset spectrum condition, said coefficient adjuster reduces the current value of said power adjusting coefficient and the step size for adjusting until the preset spectrum condition is matched, and sends a starting notification to said pre-distortion module; and
said pre-distortion module starts or restarts said pre-distortion self-adaptive algorithm searching, in accordance with the starting notification from said power control module.

6. The power amplification device according to claim 5, wherein said preset spectrum condition comprises: an adjacent channel leakage ratio ACLR of the output signal of said power amplification module being lower than a preset threshold.

7. The power amplification device according to claim 6, wherein said threshold is a spectrum emission mask MASK or a protecting threshold which is lower than said MASK.

8. A power amplification method, comprising:
performing power adjusting on an input signal;
performing power amplification on the signal subjected to the power adjusting; and
compensating for nonlinearity produced during the power amplification;
wherein power adjusting is performed on the input signal according to a power adjusting coefficient only upon startup of a power amplification device;
wherein compensating for nonlinearity produced during the power amplification comprises:
performing pre-distortion self-adaptive algorithm searching in accordance with the signal subjected to the power amplification;
performing pre-distortion processing on the input signal based on a searched coefficient; and
sending a power adjusting notification when a convergence condition is met; and
wherein performing power adjusting on an input signal comprises:
producing an initial value of the power adjusting coefficient which is larger than 0 and smaller than 1 when said power amplification device is turned on, and adjusting said power adjusting coefficient each time when receiving the power adjusting notification until said power adjusting coefficient is adjusted to 1; and
multiplying the received signal by said power adjusting coefficient.

9. The method according to claim 8, wherein the initial value of said power adjusting coefficient is produced and said power adjusting coefficient is adjusted, in accordance with a set of parameters gradually increasing from the initial value to 1 stored in advance.

10. The method according to claim 8, wherein the initial value of said power adjusting coefficient is produced according to the initial value stored in advance, and incremental adjusting is performed on said power adjusting coefficient utilizing a step size stored in advance.

11. The method according to claim 8, further comprising:
determining whether the signal subjected to the power amplification matches a preset spectrum condition; and
wherein, said pre-distortion self-adaptive algorithm searching is started or restarted, when the determination result is that the signal subjected to the power amplification does not match the preset spectrum condition.

12. The method according to claim 8, further comprising:
determining whether the signal subjected to the power amplification matches a preset spectrum condition; and
wherein, when the determination result is that the signal subjected to the power amplification does not match the preset spectrum condition, the current value of said power adjusting coefficient and the step size for adjusting are reduced until the preset spectrum condition is matched, and said pre-distortion self-adaptive algorithm searching is started or restarted.

13. A method for acquiring a power adjusting coefficient, comprising:
performing power adjusting on an input signal according to a coefficient;
performing power amplification on the signal subjected to the power adjusting;
when the signal subjected to the power amplification does not match a preset first spectrum condition, reducing said coefficient until the signal subjected to the power amplification matches the preset first spectrum condition, and then determining said coefficient to be a state value of the power adjusting coefficient;
performing pre-distortion self-adaptive algorithm searching according to the signal subjected to the power amplification, to compensate for nonlinearity produced during the power amplification;
increasing said coefficient when the self-adaptive algorithm searching meets a convergence condition; and
repeatedly performing the above steps until said power adjusting coefficient becomes 1;
wherein, said coefficient is larger than 0 and not larger than 1.

14. The method according to claim 13, wherein said preset first spectrum condition includes: an adjacent channel leakage ratio ACLR of the signal subjected to the power amplification being lower than a preset threshold.

15. The method according to claim 14, further comprising:
restarting the pre-distortion self-adaptive algorithm searching if the signal subjected to the power amplification does not match a preset second spectrum condition, when the convergence condition is met; and
restarting the pre-distortion self-adaptive algorithm searching after reducing said coefficient, if the number of times of restarting reaches a preset threshold and the signal subjected to the power amplification still does not match the preset second spectrum condition;
wherein, the coefficient is reduced to a smaller extent than the extent to which it is increased.

16. The method according to claim 15, wherein said preset second spectrum condition comprises:
an adjacent channel leakage ratio ACLR of the signal subjected to the power amplification being within a preset range.

* * * * *